US006873932B1

(12) United States Patent
Kim

(10) Patent No.: US 6,873,932 B1
(45) Date of Patent: Mar. 29, 2005

(54) METHOD AND APPARATUS FOR PREDICTING SEMICONDUCTOR DEVICE LIFETIME

(75) Inventor: Hyeon-Seag Kim, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 51 days.

(21) Appl. No.: 10/325,194

(22) Filed: Dec. 20, 2002

(51) Int. Cl.[7] .......................... G06F 11/30; G21C 17/00
(52) U.S. Cl. ..................................................... 702/182
(58) Field of Search .......................... 702/64, 65, 117, 702/118, 179–182; 324/765, 769; 438/14, 17, 142, 149, 151, 153, 154

(56) References Cited

U.S. PATENT DOCUMENTS

| | | | |
|---|---|---|---|
| 5,943,565 A | 8/1999 | Ju | 438/231 |
| 5,952,693 A | 9/1999 | Wu et al. | 257/344 |
| 6,022,799 A | 2/2000 | Foote et al. | 438/637 |
| 6,073,082 A | 6/2000 | Maeda | 702/58 |
| 6,107,149 A | 8/2000 | Wu et al. | 438/303 |
| 6,114,210 A | 9/2000 | Wu et al. | 438/302 |
| 6,137,137 A | 10/2000 | Wu | 257/336 |
| 6,148,273 A | 11/2000 | Maeda | 702/182 |
| 6,151,561 A | 11/2000 | Maeda | 702/58 |
| 6,173,235 B1 | 1/2001 | Maeda | 702/58 |
| 6,198,301 B1 * | 3/2001 | Chetlur et al. | 324/769 |
| 6,541,285 B2 * | 4/2003 | Koike | 438/14 |
| 2002/0008252 A1 | 1/2002 | Koike | 257/200 |
| 2002/0022949 A1 | 2/2002 | Yonezawa et al. | 703/14 |

OTHER PUBLICATIONS

Analog Devices, Inc., "ADI Reliability Handbook," pp. 23–35, (2000).
Cadence Design Systems, Inc., "Electromigration for Designers, An Introduction for the Non-Specialist," (2002).

Electronic Industries Alliance, JEDEC Publication, "Failure Mechanisms and Models for Semiconductor Devices," JPEP222–A (Dec. 2001).
Electronic Industries Alliance, JEDEC Publication, "Standard Method for Calculating the Electromigration Model Parameters for Current Density and Temperature," JEDEC Standard No. 63, pp. 1–6, (Feb. 1998).
Polishchuk et al., "Hot–Carrier Reliability of P–MOSFET with Ultra–Thin Silicon Nitride Gate Dielectric," IEEE Transactions on Device and Materials Reliability, vol. 1, No. 9, pp. 1–6, (Sep. 2001).
Electronic Industries Alliance, JEDEC Publication, "N–Channel MOSFET Hot Carrier Data Analysis," JESD28–1 (Sep. 2001).
FSA Standard Foundry Process Qualification Sub–committee, Revision 2.0, pp. 1–28, (Dec. 4, 1998).
Nayak et l., "A Comprehensive Study of Performance and Reliability of P, As, and Hybrid As/P nLDD Junction or Deep–Submicron CMOS Logic Technology," 18–6:281–283 (Jun. 1997).

\* cited by examiner

Primary Examiner—Michael Nghiem
(74) Attorney, Agent, or Firm—Renner, Otto, Boisselle & Sklar, LLP

(57) ABSTRACT

A method of predicting a lifetime of a semiconductor device at a predetermined operating condition includes performing a hot carrier injection (HCI) accelerated stress test on a plurality of MOS transistors. For each HCI test, a HCI lifetime and a maximum substrate or gate current are determined. The HCI test data is fit with a hot carrier lifetime model and fitting parameters are obtained. A wafer level test is performed on at least $10^N$ transistors in which a maximum substrate or gate current is determined for each transistor. A median lifetime to failure is determined for the statistical distribution of maximum substrate or gate current values at the predetermined operating condition. From the determined median lifetime to failure, a projected lifetime at a fractional cumulative failure is calculated.

27 Claims, 10 Drawing Sheets

US 6,873,932 B1

METHOD AND APPARATUS FOR PREDICTING SEMICONDUCTOR DEVICE LIFETIME

TECHNICAL FIELD

The present invention relates to a method of estimating HCI lifetime in a MOS transistor, and to a comprehensive DC HCI lifetime projection model. More specifically, it relates to an improved method and apparatus for predicting semiconductor device lifetimes.

BACKGROUND ART

As devices have been scaled, the channel length in the semiconductor devices has become smaller and smaller. When the semiconductor devices have a gate size of 0.13 micron, for example, the extremely short channel length generates a hot carrier effect. For example, as the channel length is made smaller, it's associated electric field increases. As the electric field increases, the force on the electrons increases causing them to move faster and faster in the channel. Such energetic electrons are referred to as "hot carriers".

There is a potential barrier between the silicon substrate and the silicon dioxide ($SiO_2$) gate oxide of a metal oxide semiconductor (MOS) transistor. As electrons flow in the channel, some scattering of the electrons in the lattice of the silicon substrate occurs due to interface states and fixed charges (interface defects). As electron scattering increases, the mobility of the hot carriers is reduced, thereby reducing the current flowing through the channel. Over a period of time, hot carriers degrade the silicon bonds with an attendant increase in electron scattering due to an increase in interface and bulk defects. As a result, the transistor slows down over a period of time.

The lifetime of the transistor is normally measured as the length of time a device operates until a 10% degradation in the operation of the device is reached. This may be measured, for example, as a 10% reduction in the current flow in the channel. For example, if a transistor designed for a 10 milliamps current in 3.3 volt technology is reduced to less than 9 milliamps within one year, the semiconductor device is said to have a hot carrier lifetime of one year. The hot carrier lifetime constraints in an NMOS device limit the current drive that can be used in a given technology. By improving the hot carrier lifetime, the current drive can be increased, thereby increasing the operating speed of a device, such as a microprocessor.

In order to estimate the hot carrier degradation, hot carrier reliability has been evaluated by stress acceleration experiments under DC conditions with respect to a MOS transistor. Using the results of these tests, production processes are optimized to obtain an improved lifetime. Various models have been used, and various equations have been derived for use in extracting estimated lifetimes from experimental data obtained in stress acceleration experiments. However, most such methods have relied upon a small number of samples, and so have suffered from a variability that detracted from the reliability of the resulting estimates.

Therefore, a need remains for a method and apparatus which will allow circuit designers and fabricators to predict the lifetime of such devices. Specifically, there is a need for an improved comprehensive DC HCI lifetime projection model, and an improved method and apparatus for predicting semiconductor lifetime.

DISCLOSURE OF INVENTION

The present invention, in one embodiment, relates to a method of predicting a lifetime of a semiconductor device at a predetermined operating condition. The method includes performing a hot carrier injection (HCI) accelerated stress test on a plurality of MOS transistors. For each HCI test, the method includes determining (i) a HCI lifetime $\tau$ and (ii) at least one of a maximum substrate current $I_{submax}$ and a maximum gate current $I_{gmax}$ at which the transistor is stressed, which yields a statistical distribution of $\tau$ values. Data from the HCI tests is fit with a hot carrier lifetime model of the form: $\tau = A/(I_{submax})^m$ or $\tau = A/(I_{gmax})^m$, where A and m are fitting parameters. A and m are determined from the fitting step. A wafer level test in which either $I_{submax}$ or $I_{gmax}$ is determined for each of at least $10^N$ transistors, yielding a statistical distribution of $I_{submax}$ or $I_{gmax}$ values. A median lifetime to failure $\tau_{50\%}$ is determined for the statistical distribution of $I_{submax}$ or $I_{gmax}$ values at the predetermined operating condition, yielding a statistical distribution of $\tau_{50\%}$ values. From the determined median lifetime to failure $\tau_{50\%}$, a projected lifetime at $(10^{-(N-2)})\%$ cumulative failure $\tau_{(10^{-(N-31\ 2)})}\%$ is calculated, which corresponds to the predetermined operating condition.

The present invention, in another embodiment, relates to a method of predicting a lifetime of a semiconductor device at a predetermined operating condition. The method includes performing a hot carrier injection (HCI) accelerated test on a plurality of MOS transistors. For each HCI test, the method includes determining (i) a HCI lifetime $\tau$ and (ii) at least one of a maximum substrate current $I_{submax}$ and a maximum gate current $I_{gmax}$ at which the transistor is stressed, which yields a statistical distribution of values. Data from the HCI tests is fit with a hot carrier lifetime model of the form of: $\tau = A/(I_{submax})^m$ for NMOS transistors or $\tau = A/(I_{gmax})^m$, for PMOS transistors, where A and m are fitting parameters. A and m are determined from the fitting step. A wafer level test in which either $I_{submax}$ or $I_{gmax}$ is determined for each of at least $10^N$ transistors, yielding a statistical distribution of $I_{submax}$ or $I_{gmax}$ values. A median lifetime to failure $\tau_{50}\%$ is determined for the statistical distribution of $I_{submax}$ or $I_{gmax}$ values at the predetermined operating condition, yielding a statistical distribution of $\tau_{50\%}$ values. From the determined median lifetime to failure $\tau_{50}\%$, a projected lifetime at 0.1% cumulative failure $\tau_{0.1}\%$ is calculated, which corresponds to the predetermined operating condition.

Figure 1:
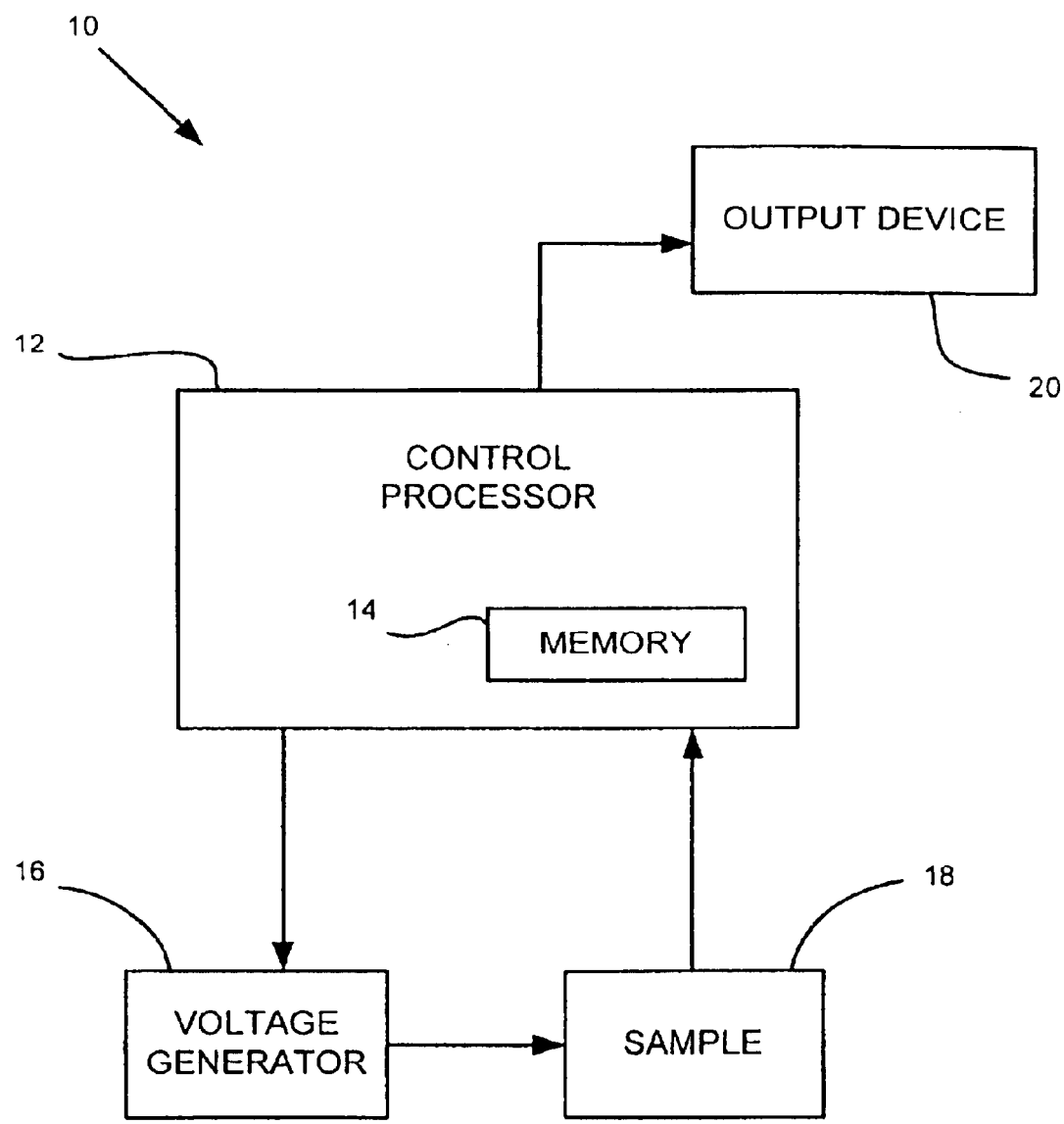
FIG. 1 is a block diagram illustrating a system suitable to carry out a method of predicting a lifetime of a semiconductor device in accordance with the present invention.

It should be appreciated that for simplicity and clarity of illustration, elements shown in the Figures have not necessarily been drawn to scale. For example, the dimensions of some of the elements are exaggerated relative to each other for clarity. Further, where considered appropriate, reference numerals have been repeated among the Figures to indicate corresponding elements.

Furthermore, it should be appreciated that the process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention.

MODES FOR CARRYING OUT THE INVENTION

In accordance with the present invention, a method and apparatus for predicting a semiconductor device lifetime is provided. More specifically, the present invention relates to a comprehensive DC HCI lifetime projection model. The present invention provides a more precise lifetime prediction with improvement in lot to lot, wafer to wafer distribution.

Referring now to FIG. 1, a system 10 that is suitable for carrying out a method of predicting a lifetime of a semiconductor device is illustrated. The system 10 can include a control processor 12, such as a computing device, containing a memory 14. The control processor 12 is operative to provide control signals to a voltage generator 16 for performing testing operations on a sample 18 in a manner described more fully below. Data can be collected from the sample 18 and processed appropriately by the control processor 12. Suitable output can be provided to an output device 20, such as, for example, a computer monitor, printer, and the like.

Figure 2:
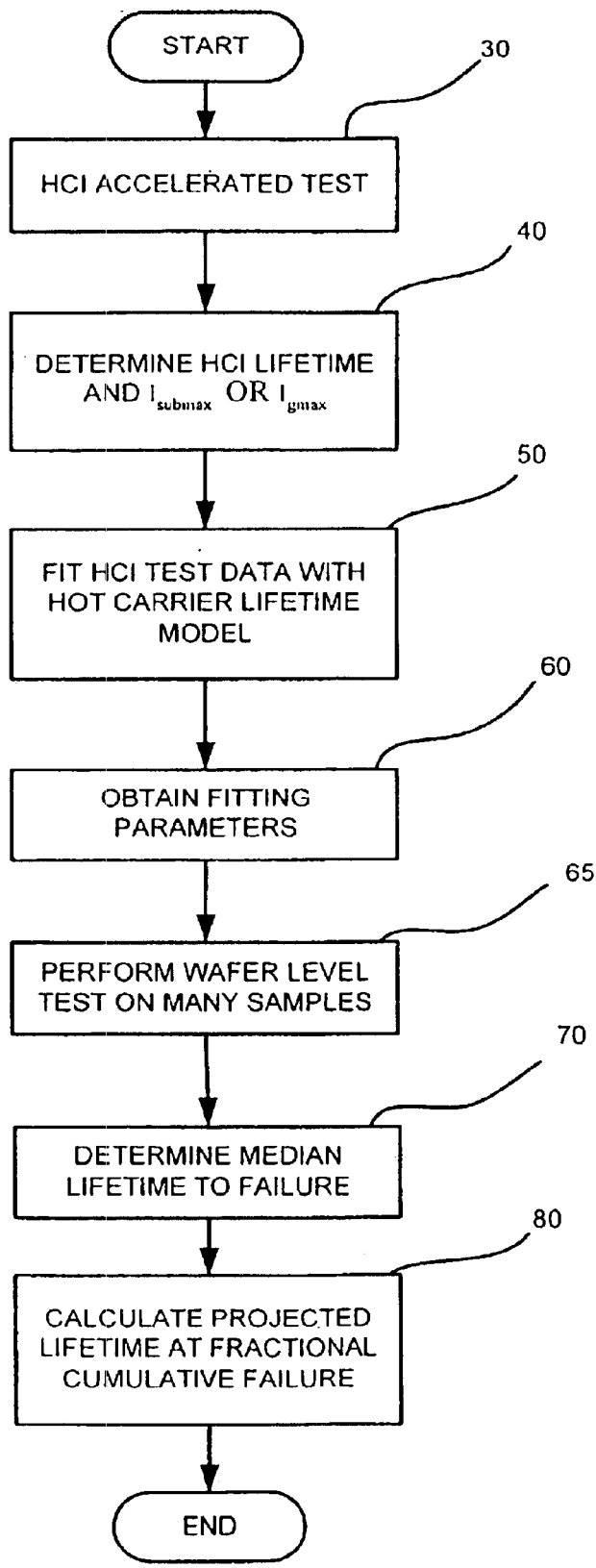
FIG. 2 is a flow chart illustrating a method of predicting a lifetime of a semiconductor device at a predetermined operating condition in accordance with the present invention.

Referring now to FIG. 2, a method of predicting a lifetime of a semiconductor device is provided. The method includes performing an accelerated stress test, such as a hot carrier injection (HCI) test, on a plurality of MOS transistors at step 30. In conducting the HCI test 30, the first step is to select drain-source voltage (also referred to as drain-stress voltage), $V_{ds}$, and gate-source voltage (also referred to a gate-stress voltage), $V_{gs}$, conditions for the acceleration test.

Figure 3:
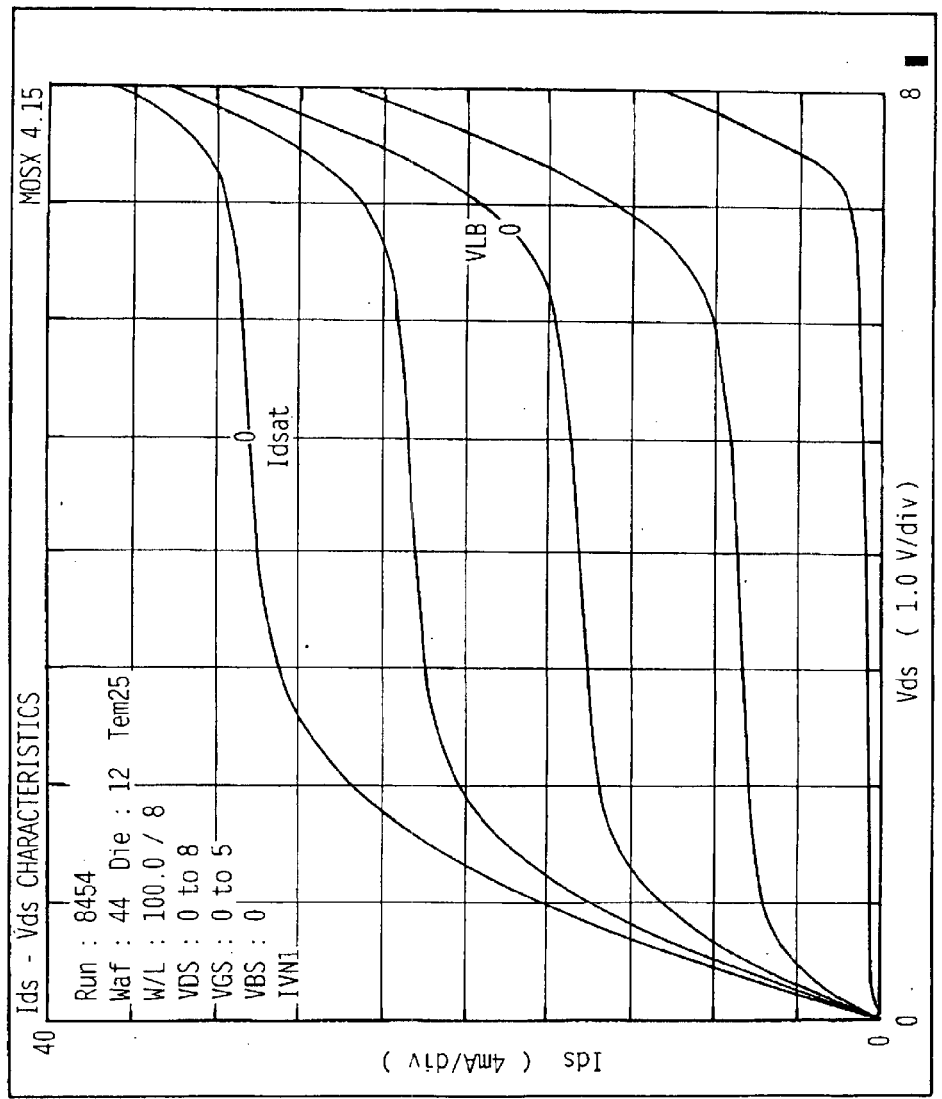
FIG. 3 is a plot of $I_{ds}$ versus $V_{ds}$ at a series of $V_{gs}$.

To obtain $V_{ds}$ values, plots of Ids versus $V_{ds}$ characteristics (commonly referred to as I–V characteristics) are generated or otherwise obtained, as shown in FIG. 3. FIG. 3 is an exemplary plot of Ids versus $V_{ds}$ at a series of $V_{gs}$ values, ranging from 1 to 5 volts.

Figure 4:
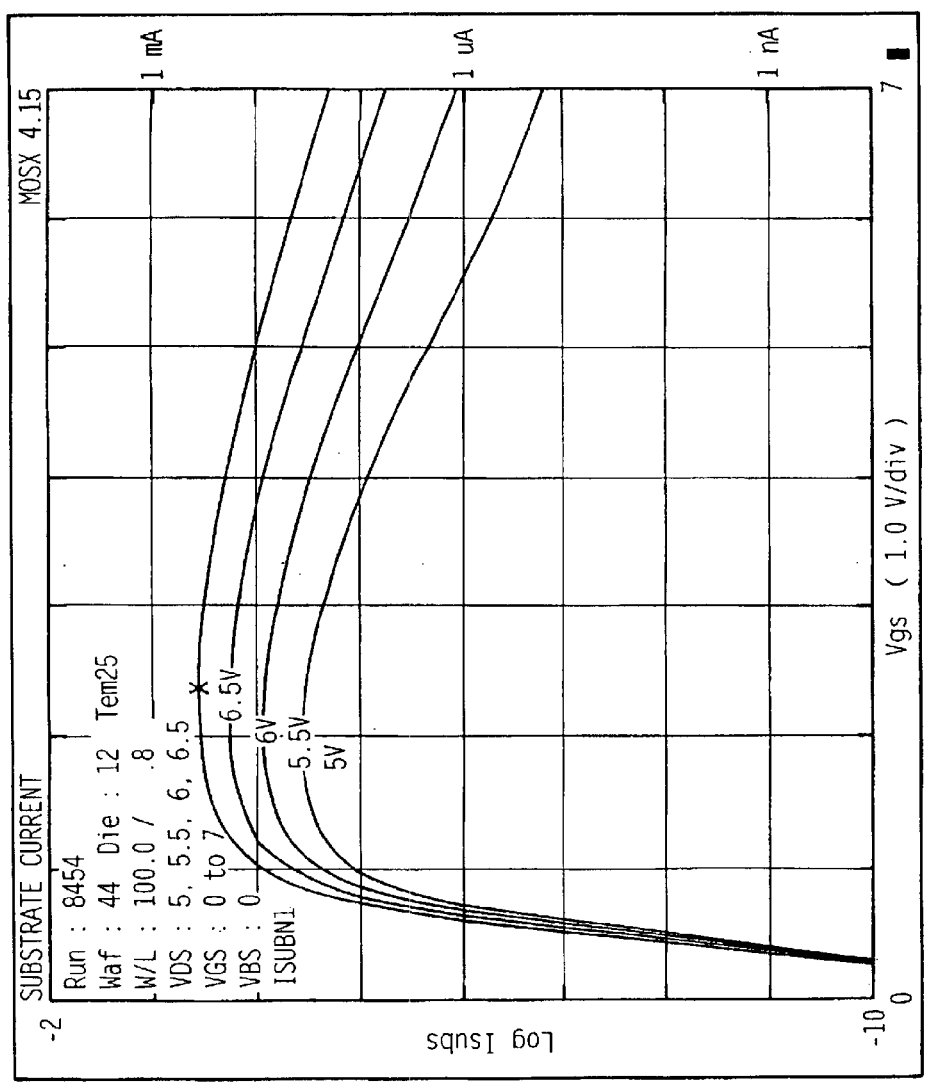
FIG. 4 is a plot of log $I_{sub}$ versus $V_{gs}$ at a series of $V_{ds}$ values.

Similarly, to obtain $V_{gs}$, plots of log $I_{sub}$ versus $V_{gs}$ characteristics are generated or otherwise obtained, as shown in FIG. 4, where $I_{sub}$ is the substrate current. FIG. 4 is a plot of log $I_{sub}$ versus $V_{gs}$ at a series of $V_{ds}$ values, ranging from 5 to 6.5 volts. For a given $V_{ds}$ value, each value of $V_{gs}$ is determined at a condition where the hot carrier degradation rate is maximized. In other words, as shown in FIG. 3, for each $V_{ds}$ value, a plot of log $I_{sub}$ versus $V_{gs}$ is generated and $V_{gs}$ is selected such that $I_{sub}$ is maximized (referred to herein as $I_{submax}$) Alternatively, $V_{ds}$ and $V_{gs}$ conditions can be selected such that the gate current $I_g$ is maximized (referred to herein as $I_{gmax}$). Preferably, the measurements illustrated in FIGS. 3 and 4 are carried out at room temperature (e.g., about 25° C.). However it is to be appreciated that these measurements may be carried out at other suitable temperatures.

When the $V_{ds}$ and $V_{gs}$ conditions for the accelerated stress tests have been determined, the HCI test is carried out for each of a plurality of devices by stressing one or more of the devices in a sample set at the determined test conditions. The HCI accelerated stress test is carried out on a relatively small number of samples. In one embodiment, the HCI accelerated stress test is carried out on no more than 25 samples. However, it is to be appreciate that the HCI accelerated stress test may be performed on greater or fewer samples without departing from the scope of the present invention.

Figure 5:
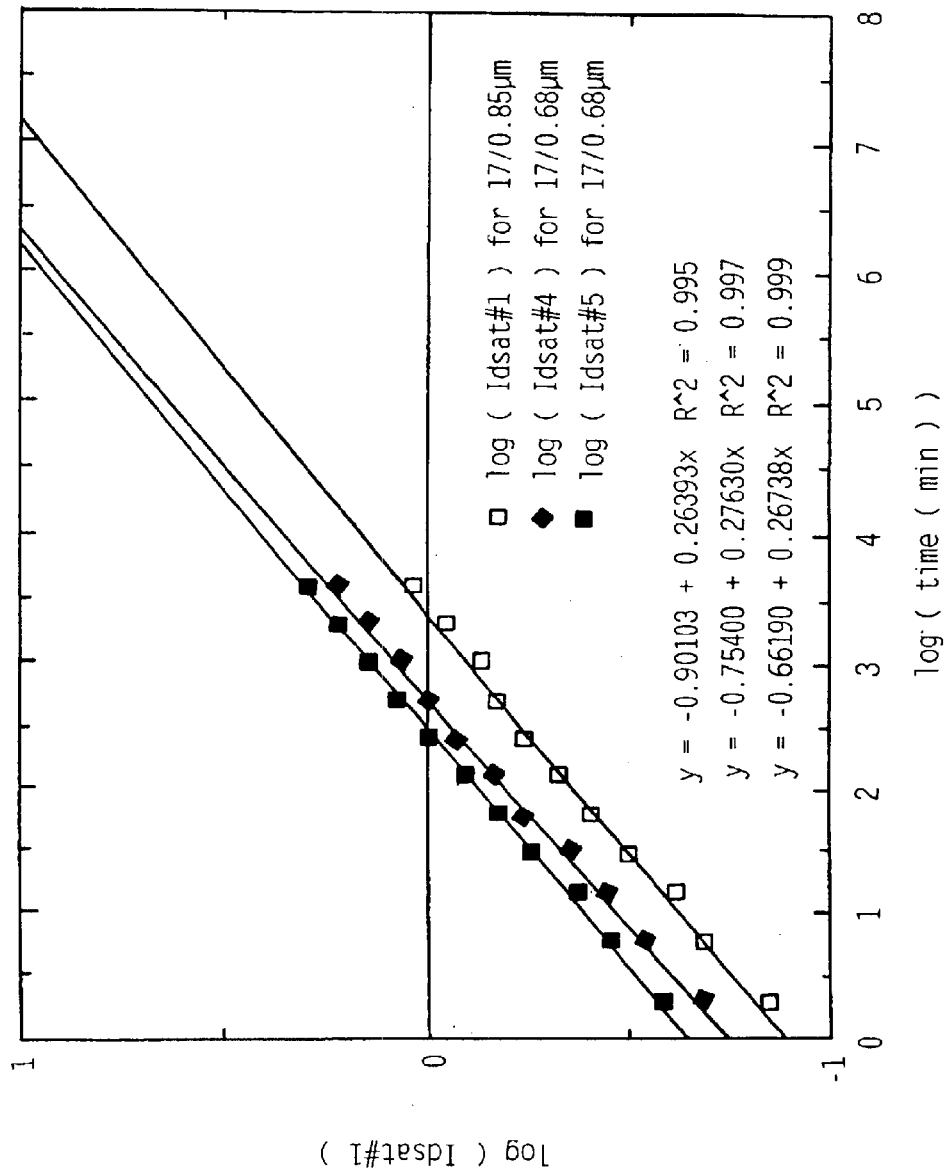
FIG. 5 is a plot of HCI data, showing log ($I_{dsat}$) versus log (time) in minutes.

At step 40, the method illustrated in FIG. 1 includes determining the HCI lifetime and at least one of $I_{submax}$ and $I_{gmax}$ for each device being tested. In one embodiment, $I_{submax}$ is measured for NMOS transistors, while $I_{gmax}$ is measured for PMOS transistors. In one embodiment, device DC HCI lifetime is typically defined as the time required to cause a 10% degradation of the forward drain current in saturation mode ($I_{dsat}$) under operation condition $V_{cc}$. This may be defined as the calculated time for $\Delta I_{dsat}/I_{dsat}$ in the forward direction, stressed at a maximum substrate current $I_{submax}$ for NMOS and stressed at maximum gate current $I_{gmax}$ for PMOS, to change by 10% using the hot carrier injection lest method described herein. The HCI lifetime at $I_{dsat}$ 10% degradation is estimated from a graph, such as shown in FIG. 5, for example. FIG. 5 is an exemplary plot Of $I_{dsat}$ versus log of stress time for a sample group stressed at a $V_{ds}$ of 6.5 volts and a $V_{gs}$ of 2.8 volts. The HCI accelerated test may be run for about 100 hours to about 150 hours. At the completion of the test period, HCI lifetime and $I_{submax}$ or $I_{gmax}$ data are collected.

In one embodiment, maximum substrate current $I_{submax}$ is defined as the peak current in microamps per micrometer ($\mu A/\mu m$) of gate width for an N-channel transistor at the minimum operating temperature and maximum $V_{DD}$. Maximum gate current $I_{gmax}$ is defined as the peak electronic current in nanoamps per micrometer (nA/$\mu$m) at certain $V_{ds}$ for P-channel transistor at the minimum operating temperature and maximum $V_{DD}$. Hot carrier injection is defined as the phenomenon in which electrons or holes, from electron-hole pairs generated by impact ionization in the high field region near the drain, are energetic enough to be injected into the gate oxide or dielectric layer. Impact ionization is the generation of electron-hole pairs by the collision of energetic carriers (usually electrons) with lattice atoms.

Figure 6:
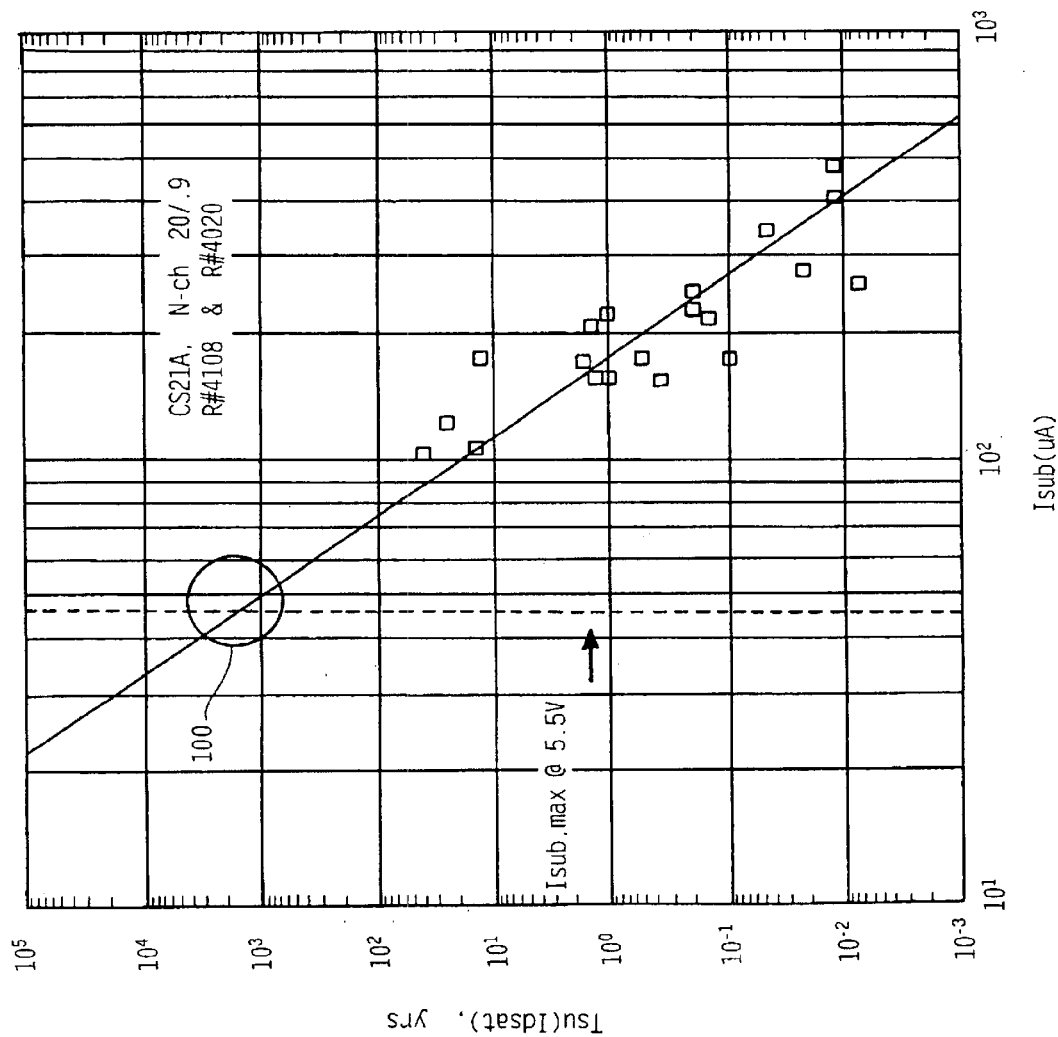
FIG. 6 is a plot of lifetime versus $I_{submax}$ from an exemplary lifetime test of an NMOS transistor.
Figure 7:
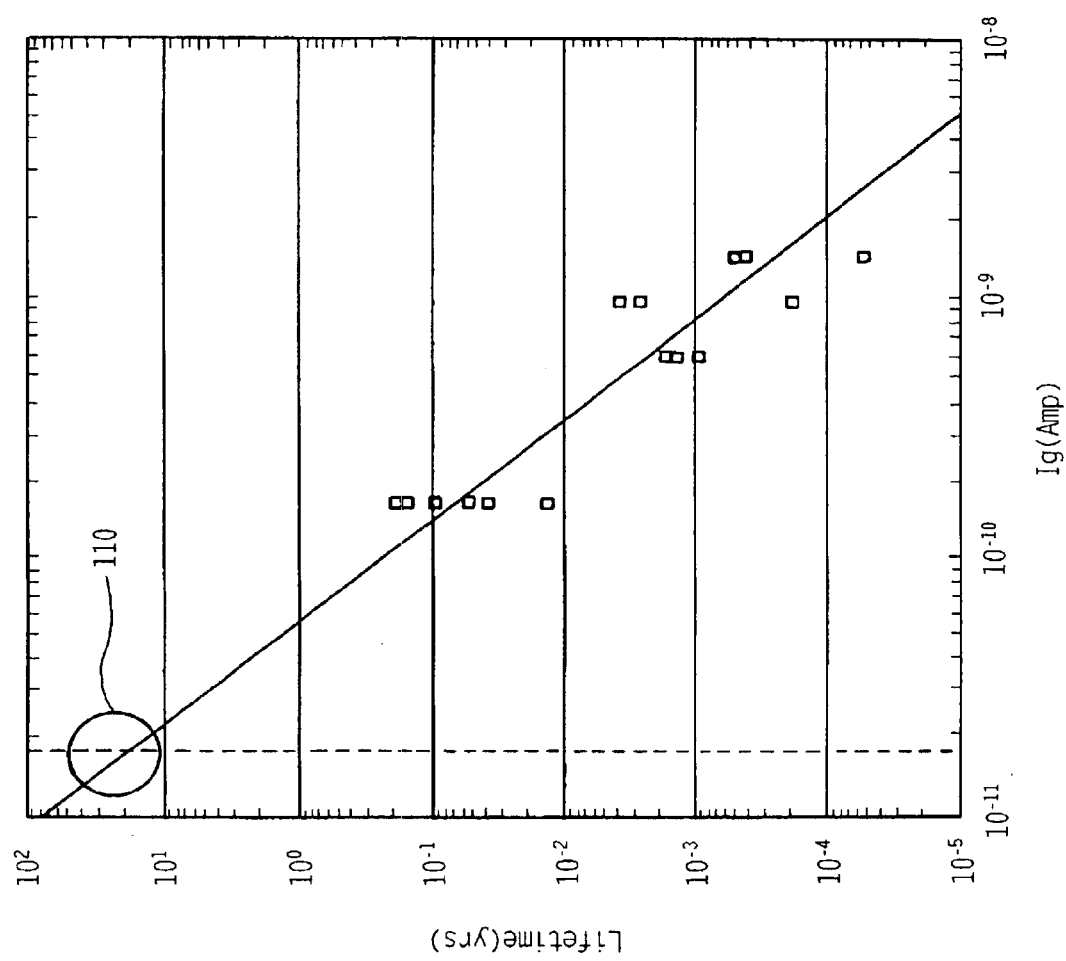
FIG. 7 is a plot of lifetime versus $I_{gmax}$ from an exemplary lifetime test of a PMOS transistor.
Figure 8:
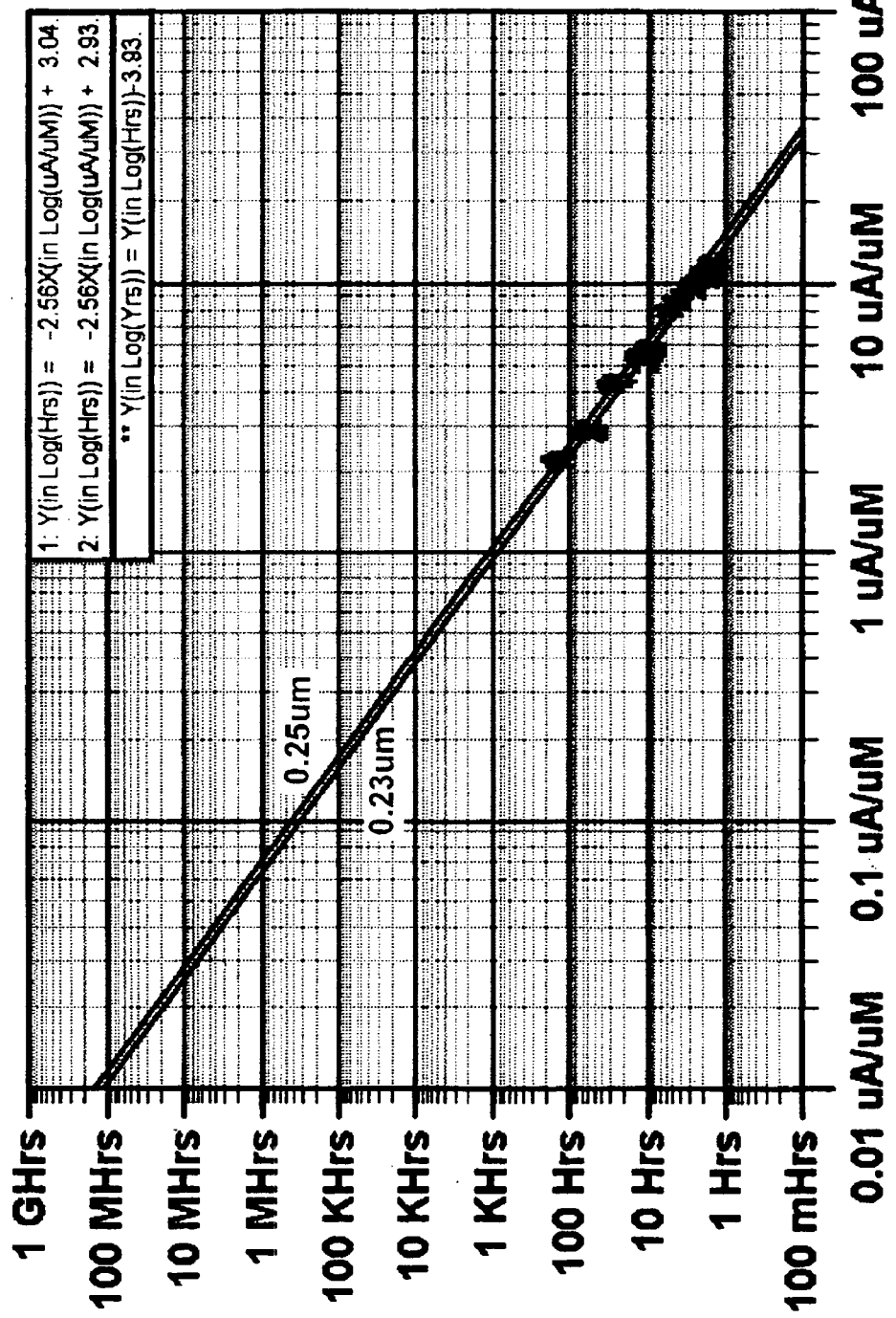
FIG. 8 is a plot of HCI lifetime versus $I_{sub}$/W for 0.23 and 0.25 micrometer LV NMOS Enh Thick in Pwell.

Once the HCI lifetime (referred to herein as τ) and $I_{submax}$ and $I_{gmax}$ data are collected, this data call be plotted on a log-log scale. For example, FIG. 6 illustrates an exemplary log-log plot of HCI lifetime τ vs. $I_{submax}$ for accelerated stress tests performed on a sample set of NMOS transistors. In addition, FIG. 7 illustrates an exemplary log-log plot of HCI lifetime τ vs. $I_{gmax}$ for accelerated stress tests performed on a sample set of PMOS transistors. Further, FIG. 8 illustrates an exemplary log-log plot of HCI lifetime τ versus $I_{submax}$/W for 0.23 and 0.25 micrometer LV NMOS in Pwell. W is the width of the channel in the LV NMOS.

With continued reference to FIG. 2, at step 50, the HCI test data can be fit with a comprehensive DC HCI lifetime projection model. In one embodiment, for both high and low voltage NMOS and PMOS transistors the following equations are provided, respectively:

$\tau = A/(I_{submax})^m$ (for NMOS)

$\tau = A/(I_{gmax})^m$ (for PMOS)

where τ is the device lifetime, $I_{submax}$ and $I_{gmax}$ are the maximum substrate current and maximum gate current, respectively, m is the slope and A is the intersection in the plot of log (τ) vs. log ($I_{submax}$ or $I_{gmax}$). This step can be performed using conventional curve fitting software, which employs a least squares fit or the like. As shown in FIGS. 6–8, the above-enumerated HCI lifetime projection models provide a good fit to the exemplary data collected at steps 30 and 40. At step 60, fitting parameters A and m are obtained or otherwise calculated for any given substrate or wafer or sample devices.

At step 65, a wafer level test is performed on a relatively large number of samples. The wafer level test 65 includes, for a given operating condition, e.g., a given operating bias ($V_{cc}$), $I_{submax}$ or $I_{gmax}$ can be determined for all of the samples over a relatively short time period. In one embodiment, the wafer level test is performed on at least 100 devices. In one embodiment, the wafer level test is performed on about 1,000 devices simultaneously. In another embodiment, larger numbers of devices, such as about 5,000, about 10,000, or about 100,000, are tested simultaneously. It is to be appreciated that utilization of a simple wafer level test, as is described herein, facilitates efficient data collection. For example, in one embodiment, a 1,000 sample test requires about 30 minutes of data collection time.

The wafer level test 65 yields a statistical distribution of $I_{submax}$ or $I_{gmax}$ values, depending upon which is measured. At step 70, a median lifetime to failure ($\tau_{50\%}$) is determined from the statistical distribution of $I_{submax}$ or $I_{gmax}$ values at the predetermined operating conditions. In one embodiment, the median lifetime to failure ($\tau_{50\%}$) is determined based on the following calculation:

$$\tau_{50\%} = A/(I_{submax})^m \cdot \exp(E_a/kT),$$

where $E_a$ is an activation energy associated with the semiconductor devices under test, k is Boltzmann's constant, and T is the temperature at which the HCI tests are performed. Alternatively, HCI tests are performed at a variety of temperatures and the median lifetime to failure ($\tau_{50\%}$) is determined based on the following calculation:

$$\tau_{50\%} = A/(I_{submax})^m \cdot \exp(E_a/k(T_{test} - T_{operating})),$$

where $E_a$ is an activation energy associated with the semiconductor devices under test, k is Boltzmann's constant, $T_{test}$ is the temperature at which the HCI tests are performed, and $T_{operating}$ is the predetermined device operating temperature. For each device tested using the wafer level test 65, $I_{submax}$ or $I_{gmax}$ is determined from the wafer level test, while fitting parameters A and m are known from the relatively few HCI tests. HCI tests can be performed at a variety of temperatures and the median lifetime to failure ($\tau_{50\%}$) is determined based on the following calculation:

$$\tau_{50\%} = A/(I_{gmax})^m \exp(E_a/k(T_{test} - T_{operating})).$$

It is to be appreciated that, for devices having unknown activation energies, the activation energy may be determined by plotting median lifetime to failure ($\tau_{50\%}$) vs. $T_{test}$ on a log-log scale, where the slope of the plot provides the activation energy $E_a$. Of course, median lifetime to failure ($\tau_{50\%}$) can be determined at each temperature using the curve extrapolation explained more fully above.

In an alternative embodiment, step 70 can include extrapolating the median lifetime to failure $\tau_{50\%}$ at the predetermined operating conditions. For example, in FIG. 6, the extrapolated data (indicated at 100) indicates an estimated $\tau_{50\%}$ of approximately $1.73 \times 10^3$ years for a value of $I_{submax}$ corresponding to predetermined operating conditions at $V_{DS}$ of approximately 5.5 volts. In FIG. 7, for example, the extrapolated data (indicated at 110) shows an estimated $\tau_{50\%}$ of approximately 18.8 years for an $I_{gmax}$ corresponding to predetermined operating conditions of $V_{ds}$ and $V_{gs}$.

At step 80, a predicted lifetime to 0.1% cumulative failure ($\tau_{0.1\%}$) corresponding to the predetermined operating conditions can be calculated. In one embodiment, the predicted lifetime to cumulative failure can be calculated or otherwise predicted using the following experimental model:

$$\tau_{0.1\%} = \tau_{50\%} \operatorname{Exp}(-cdf^{-1}(0.1\%) \cdot \sigma),$$

where $cdf^{-1}(0.1\%)$ is an inverse cumulative distribution function operator associated with 0.1% cumulative failure ($cdf^{-1}(0.1\%)$ is about 3.091), $\tau_{50\%}$ is median time to failure and σ is the standard deviation. For the statistical treatments of s-shape or bi-modal distribution calculation, $$\tau_{0.1\%} = \tau'\{0.1 \cdot ((i/10^N)\%)\} = \tau'_{50\%} \cdot \exp\{-cdf^{-1}((i/10^N\%)) \times \sigma'\}$$

wherein $10^N$ is the total number of samples, i is the number of early failures, $\tau'_{50\%}$ is the 50% cumulative of early failure and σ' is the standard deviation of the early failure.

Figure 9:
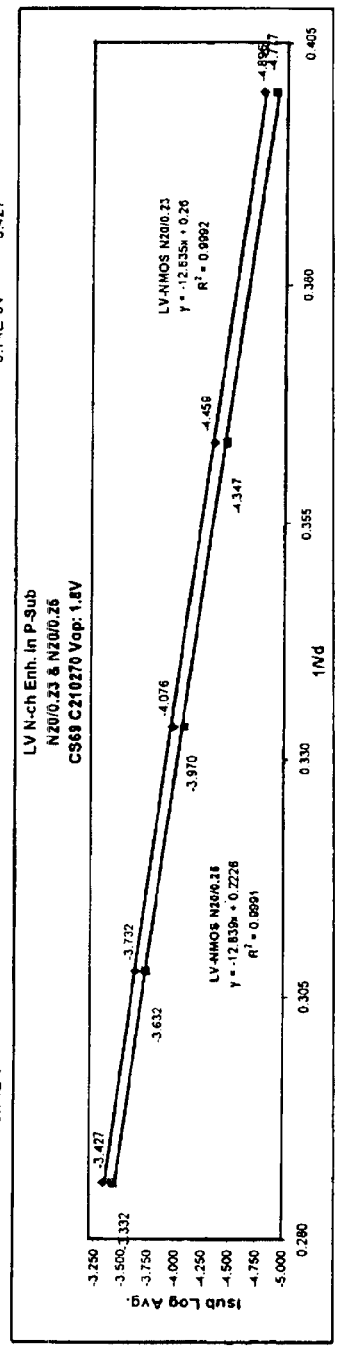
FIG. 9 is a plot of $I_{sub}$ Log Avg. versus $I/V_d$ for N20/0.23 and N20/0.25 samples.

Stated differently, once $I_{submax}$ is obtained from the wafer level test of the samples at a given operating bias ($V_{cc}$), $I_{submax}$ versus $I/V_d$ can be plotted. Since A and m are known, one can calculate $\tau_{0.1\%}$, the lifetime at 0.1% cumulative failure, as shown in FIG. 9. FIG. 9 is a plot of $I_{submax}$ Log Avg. versus $I/V_d$ for N20/0.23 and N20/0.25 samples at a $V_d$ of 2.8 volts. The lifetime at 0.1% cumulative failure under operating conditions may be evaluated by using the following experimental model:

$$\tau_{0.1\%-\tau 50\%} \operatorname{Exp}(-cdf^{-1}(0.1\%) \cdot \sigma)$$

where $cdf^{-1}(0.1\%)$ is 3.091, $\tau_{50\%}$ is the 0.1% cumulative failure and σ is the standard deviation.

In one embodiment, the sample size for obtaining the values of A and m is about 25, while the sample size for the wafer level test is about 1,000, that is, 24 wafers containing 50 die each are tested. Although this is a large number of tests, the results provide a much more statistically significant and reliable estimate of the lifetime of the semiconductor device. Alternatively, larger numbers of devices, such as about 5,000, about 10,000, or about 100,000, may be tested. Testing larger numbers of devices allows for a more accurate semiconductor device lifetime prediction. For example, $10^N$ MOS transistors may be tested, where N is an integer greater than 2. For a test on such a sample size, a projected lifetime at $(10^{-(N-2)})\%$ cumulative failure ($\tau_{(10}^{-(N-2)}\%)$) can be calculated using the methodology described more fully above.

Therefore, in one embodiment, for a wafer or substrate containing 10,000 transistors, a projected lifetime at 0.01% cumulative failure can be predicted. In another embodiment, for a product containing 100,000 transistors, a projected lifetime at 0.001% cumulative failure can be predicted. Similarly, for a product containing 1,000,000 transistors, a projected lifetime at 0.0001% cumulative failure can be predicted.

In addition, as is explained more fully above, if $E_a$ is available, the lifetime for different operating temperatures can be estimated. Otherwise, $E_a$ can be calculated based on data collected at different operating and/or testing temperatures.

Figure 10:
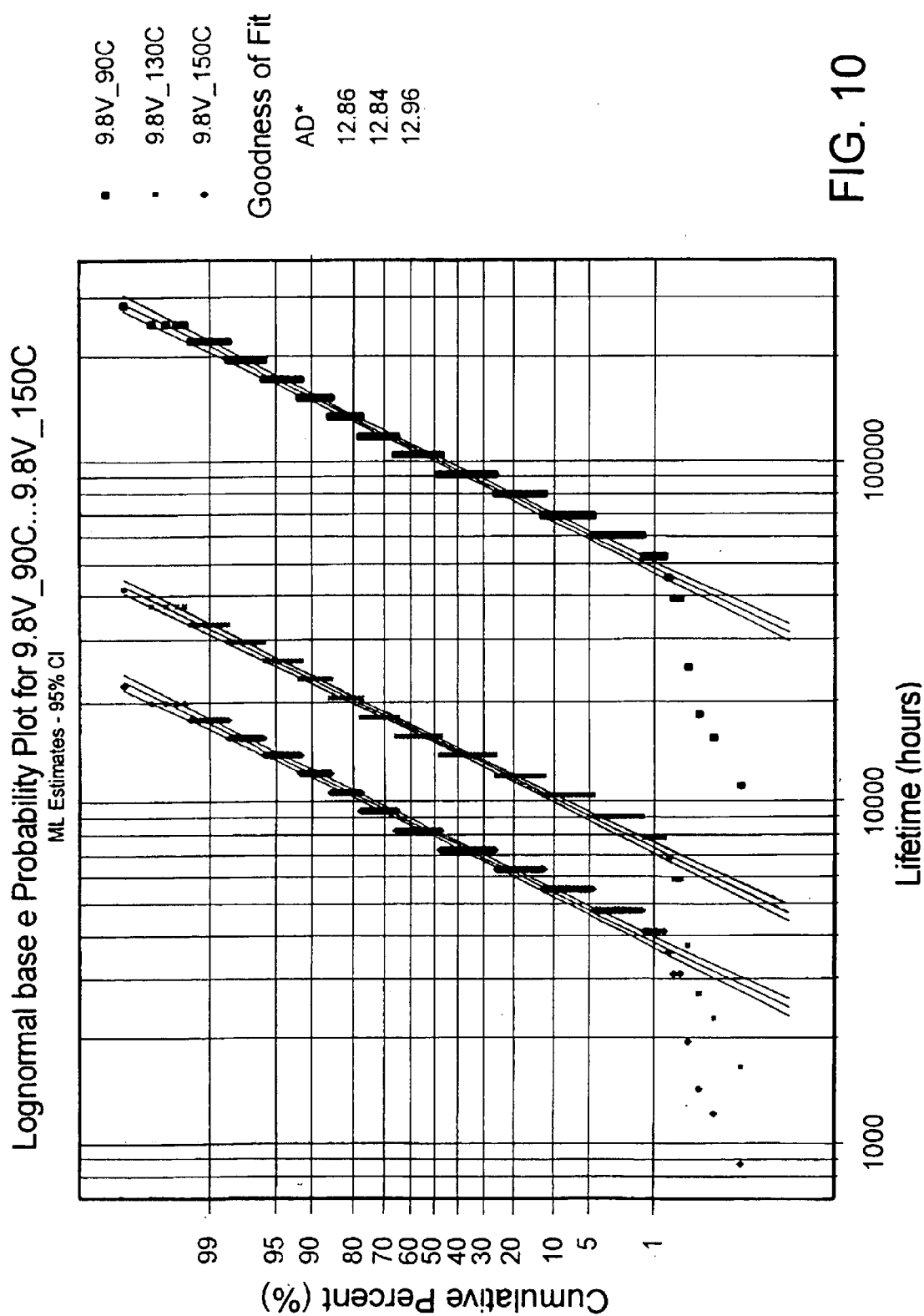
FIG. 10 is a lognormal base e probability plot for 9.8 volts at 90° C., 130° C. and 150° C., in which cumulative percent failure is plotted against lifetime in hours.

The results obtained through the predictive calculations described more fully above can be plotted, as shown in FIG. 10. FIG. 10 is a lognormal base e probability plot for 9.8 volts at 90° C., 130° C. and 150° C., in which cumulative percent failure is plotted against lifetime in hours.

In one embodiment, for a given desired lifetime at 0.1% cumulative failure ($\tau_{0.1\%}$), e.g., about five years, an inverse calculation can be performed to find the corresponding value of $I_{submax}$ using the following equations:

$$\tau_{50\%}=A/(I_{submax})^m \cdot \exp\ (E_a/k(T_{test}-T_{operating}))\ \text{and}$$

$$\tau_{0.1\%}=\tau_{50\%}\ \mathrm{Exp}(-\mathrm{cdf}^{-1}(0.1\%)\cdot\sigma).$$

Once $I_{submax}$ is determined, the maximum operating bias $V_{cc}$ corresponding to this value of $I_{submax}$ can be found from FIG. 9, utilizing the inverse relationship between operating bias $V_{cc}$ and $I_{submax}$. It is to be appreciated that this methodology may be employed analogously to values of $I_{gmax}$ for tests performed on PMOS transistors.

INDUSTRIAL APPLICABILITY

The present invention, by providing a method and apparatus for predicting a lifetime of a semiconductor device at a predetermined operating condition provides a solution to the problem of accurately and comprehensively predicting the lifetime of semiconductor devices for use by circuit designers and fabricators. This feature of the invention allows circuit and device designers more quickly and more accurately to predict device lifetimes, allowing enhanced optimization of designs and processes.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, the thicknesses of the individual layers making up the ONO structure can be varied from that described herein. It is therefore intended to include within the invention all such variations and modifications that fall within the scope of the appended claims and equivalents thereof.

What is claimed is:

1. A method of predicting the lifetime of a semiconductor device at a predetermined operating condition, said method comprising:
   (a) performing a hot carrier injection (HCI) accelerated stress test on a plurality of MOS transistors;
   (b) for each HCI test, determining (i) a HCI lifetime $\tau$ and (ii) at least one of a maximum substrate current $I_{submax}$ and a maximum gate current $I_{gmax}$ at which the transistor is stressed;
   (c) fitting data from the HCI tests with a hot carrier lifetime model of the form of at least one of:

$$\tau=A/(I_{submax})^m,\ \text{and}$$

$$\tau=A/(I_{gmax})^m,$$

where A and m are fitting parameters;
   (d) obtaining A and m from the fitting step;
   (e) performing a wafer level test on at least $10^N$ MOS transistors, where N is an integer greater than 2, in which at least one of (i) $I_{submax}$ and (ii) $I_{gmax}$ is determined for each of the at least $10^N$ MOS transistors, yielding a statistical distribution of one of (i) $I_{submax}$ values and (ii) $I_{gmax}$ values;
   (f) determining a median lifetime to failure $\tau_{50\%}$ for the statistical distribution of at least one of (i)) $I_{submax}$ values and (ii) $I_{gmax}$ values at the predetermined operating condition, yielding a statistical distribution of $\tau_{50\%}$ values; and
   (g) from the determined median lifetime to failure $\tau_{50\%}$, calculating a projected lifetime at $(10^{-(N-2)})\%$ cumulative failure $\tau_{(10}{}^{-(N-2)})\%$ corresponding to the predetermined operating condition.

2. The method of predicting a lifetime of a semiconductor device according to claim 1, wherein step (a) includes: performing the HCI test on no more than 25 samples.

3. The method of predicting a lifetime of a semiconductor device according to claim 2, wherein step (f) includes:
   determining a value of $I_{submax}$ corresponding to the predetermined operating condition;
   determining an activation energy $E_a$ associated with the semiconductor device; and
   calculating $\tau_{50\%}$ according to $$\tau_{50\%}=A/(I_{submax})^m \cdot \exp\ (E_a/kT),$$

where k is Boltzmann's constant, and T is the temperature at which step (e) was performed.

4. The method of predicting a lifetime of a semiconductor device according to claim 3, further comprising:
   selecting an acceptable value of $\tau_{(10}{}^{-(N-2)})\%$;
   calculating $I_{submax}$ according to $$\tau_{50\%}=A/(I_{submax})^m \cdot \exp\ (E_a/kT),\ \text{and}$$

$$\tau_{(10}{}^{-(N-2)})\%=\tau_{50\%}\ \exp(-\mathrm{cdf}^{-1}(10^{-(N-2)}\%)\cdot\sigma)$$

where $\mathrm{cdf}^{-1}\ ((10^{-(N-2)})\%)$ is an inverse cumulative distribution function operator associated with $(10^{-(N-2)})\%$ cumulative failure, and $\sigma$ is the standard deviation of the plurality of $\tau_{50\%}$ values determined in step (f); and
   from the calculated value of $I_{submax}$, determining a maximum operating bias corresponding to the selected acceptable value of $\tau_{(10}{}^{-(N-2)})\%$.

5. The method of predicting a lifetime of a semiconductor device according to claim 3, wherein step (g) includes:
   for a normal statistical distribution of $\tau_{50\%}$ values, calculating the projected lifetime at $(10^{-(N-2)})\%$ cumulative failure $\tau_{(10}{}^{-(N-2)})\%$ according to:

$$\tau_{(10}{}^{-(N-2)})\%=\tau_{50\%}\ \exp(-\mathrm{cdf}^{-1}(10^{-(N-2)}\%)\cdot\sigma)$$

where $\mathrm{cdf}^{-1}\ ((10^{(N-2)})\%)$ is an inverse cumulative distribution function operator associated with $(10^{-(N-2)})\%$ cumulative failure, and $\sigma$ is the standard deviation of the plurality of $\tau_{50\%}$ values determined in step (f).

6. The method of predicting a lifetime of a semiconductor device according to claim 3, wherein step (g) includes:
   for a normal statistical distribution of $\tau_{50\%}$ values, calculating the projected lifetime at 0.1% cumulative failure $\tau_{0.1\%}$ according to:

$$\tau_{0.1\%}=\tau_{50\%}\ \exp(-\mathrm{cdf}^{-1}(0.1\%)\cdot\sigma)$$

where $\mathrm{cdf}^-(0.1\%)$ is an inverse cumulative distribution function operator associated with 0.1% cumulative failure, and $\sigma$ is the standard deviation of the plurality of $\tau_{50\%}$ values determined in step (f).

7. The method of predicting a lifetime of a semiconductor device according to claim 3, wherein step (g) includes:
   for a bi-modal statistical distribution of $\tau_{50\%}$ values, calculating the projected lifetime at $(10^{-(N-2)})\%$ cumulative failure $\tau_{(10}{}^{-(N-2)})\%$ according to:

$$\tau_{(10}{}^{-(N-2)})\%=\tau'_{50\%}\ \exp(-\mathrm{cdf}^{-1}((i/10^N)\%)\cdot\sigma')$$

where $\tau'_{50\%}$ is a median lifetime to early failure, i is the number of early failures, $10^N$ is the total number of transistors tested in step (e), $\mathrm{cdf}^{-1}$ $((i/10^N)\%)$ is an inverse cumulative distribution function operator associated with $(10^{-(N-2)})\%$ of early failures, and $\sigma'$ is the standard deviation of the plurality of early failure $\tau_{50\%}$ values determined in step (f).

8. The method of predicting a lifetime of a semiconductor device according to claim 3, wherein step (g) includes:

for a bi-modal statistical distribution of $\tau_{50\%}$ values, calculating the projected lifetime at 0.1% cumulative failure $\tau_{0.1\%}$ according to:

$$\tau_{0.1\%} = \tau'_{50\%} \exp(-\mathrm{cdf}^{-1}((i/10^N)\%) \cdot \sigma')$$

where $\tau'_{50\%}$ is a median lifetime to early failure, i is the number of early failures, $10^N$ is the total number of transistors tested in step (e), $\mathrm{cdf}^{-1}$ $((i/10^N)\%)$ is an inverse cumulative distribution function operator associated with 0.1% of early failures, and $\sigma'$ is the standard deviation of the plurality of early failure $\tau_{50\%}$ values determined in step (f).

9. The method of predicting a lifetime of a semiconductor device according to claim 1, wherein step (d) includes:

plotting at least one of (i) log ($\tau$) vs log ($I_{submax}$) and (ii) log ($\tau$) vs. log ($I_{gmax}$);

determining m as a slope of the plot and A as an intercept of the plot.

10. The method of predicting a lifetime of a semiconductor device according to claim 1, wherein step (a) is performed for a plurality of $V_{ds}$ and $I_{ds}$ values and a plurality of $V_{gs}$ values corresponding to individual $I_{submax}$ values.

11. The method of predicting a lifetime of a semiconductor device according to claim 1, wherein each HCI accelerated-stress is performed for no more than about 100 fours to about 150 hours.

12. The method of predicting a lifetime of a semiconductor device according to claim 1, wherein the wafer level test is performed for no more than about 1 hour.

13. The method of predicting a lifetime of a semiconductor device according to claim 1, wherein a HCI lifetime a period of time corresponding to a change in $I_{ds}$ of about 10%.

14. The method of predicting a lifetime of a semiconductor device according to claim 1, wherein step (a) is performed at a plurality of temperatures.

15. The method of predicting a lifetime of a semiconductor device according to claim 14, wherein step (f) includes:

determining a value of $I_{submax}$ corresponding to the predetermined operating condition;

determining an activation energy $E_a$ associated with the semiconductor device; and calculating $\tau_{50\%}$ according to at least one of:

$$\tau_{50\%} = A/(I_{submax})^m \cdot \exp(E_a/k(T_{test} - T_{operating})), \text{ and}$$

$$\tau_{50\%} = A/(I_{gmax})^m \cdot \exp(E_a/k)(T_{test} - T_{operating})),$$

where $E_a$ is an activation energy associated with the semiconductor devices under test, k is Boltzmann's constant, $T_{test}$ is the temperature at which the HCI tests are performed, and $T_{operating}$ is a predetermined device operating temperature.

16. The method of predicting a lifetime of a semiconductor device according to claim 1, wherein the predetermined operating conditions are $V_{ds}$ of about $V_{DDMAX}$ and a temperature of about 25C., where $V_{DDMAX}$ is a maximum drain voltage.

17. A system for carrying out the method of claim 1, the system comprising:

a control processor for carrying out steps (a)–(g) of the method;

a voltage generator, said voltage generator applying appropriate voltages to the plurality of transistors in response to control signals received from the control processor; and an output device operatively connected to the control processor for visually displaying data related to the calculated projected lifetime.

18. A method of predicting a lifetime of a semiconductor device at a predetermined operating condition, said method comprising (a) performing a hot carrier injection (HCI) accelerated stress test on a plurality of MOS transistors;

(b) for each HCI test, determining (i) a HCI lifetime $\tau$ and (ii) at least one of a maximum substrate current $I_{submax}$ and a maximum gate current $I_{gmax}$ at which the transistor is stressed;

(c) fitting data from the HCI tests with a hot carrier lifetime model of the form:

$$\tau = A/(I_{submax})^m \text{ for NMOS transistors, and}$$

$$\tau = A/(I_{gmax})^m \text{ for PMOS transistors,}$$

where A and m are fitting parameters;

(d) obtaining A and m from the fitting step;

(e) performing a wafer level test on at least $10^N$ MOS transistors, where N is an integer greater than 1, in which at least one of (i)$I_{submax}$ and (ii) $I_{gmax}$ is determined for each of the at least $10^N$ MOS transistors, yielding a statistical distribution of one of (i) $I_{submax}$ values and (ii) $I_{gmax}$ values;

(f) determining a median lifetime to failure $\tau_{50\%}$ for the statistical distribution of at least one of (i)) $I_{submax}$ values and (ii) $I_{gmax}$ values at the predetermined operating condition, yielding a statistical distribution of $\tau_{50\%}$ values; and (g) from the determined median lifetime to failure $\tau_{50\%}$, calculating a projected lifetime at 0.1% cumulative failure $\tau_{0.1\%}$ corresponding to the predetermined operating condition.

19. The method of predicting a lifetime of a semiconductor according to claim 18, wherein step (d) includes: plotting log ($\tau$) vs. log ($I_{submax}$) for NMOS transistors and plotting log ($\tau$) vs. log ($I_{gmax}$) for PMOS transistors;

determining m as a slope of the plot and A as an intercept of the plot.

20. The method of predicting a lifetime of a semiconductor according to claim 19, wherein step (f) includes:

determining a value of $I_{submax}$ corresponding to the predetermined operating condition;

determining an activation energy $E_a$ associated with the semiconductor device; and calculating $\tau_{50\%}$ according to $$\tau_{50\%} = A/(I_{submax})^m \exp(E_a/kT),$$

where k is Boltzmann's constant, and T is the temperature at which step (a) was performed.

21. The method of predicting a lifetime of a semiconductor device according to claim 19, wherein step (g) includes:

for a normal statistical distribution of $\tau_{50\%}$ values, calculating the projected lifetime at 0.1% cumulative failure 0.1% according to:

$$\tau_{0.1} = \tau_{50\%} \exp(-\mathrm{cdf}^{-1}(0.1\%) \cdot \sigma)$$

where $\mathrm{cdf}^{-1}(0.1\%)$ is an inverse cumulative distribution function operator associated with 0.1% cumulative failure, and $\sigma$ is the standard deviation of the plurality of $\tau_{50\%}$ values determined in step (f).

22. The method of predicting a lifetime of a semiconductor device according to claim 21, wherein step (g) includes:

for a bi-modal statistical distribution of $\tau_{50\%}$ values, calculating the projected lifetime at 0.1% cumulative failure $\tau_{0.1\%}$ according to:

$$\tau_{0.1\%} = \tau'_{50\%} \exp(-\mathrm{cdf}^{-1}((i/m)\%) \cdot \sigma')$$

where $\tau'_{50\%}$ is a median lifetime to early failure, i is the number of early failures, $10^N$ is the total number of transistors tested in step (e), $\mathrm{cdf}^{-1}((i/m)\%)$ is an inverse cumulative distribution function operator associated with 0.1% of early failures, and $\sigma'$ is the standard deviation of the plurality of early failure $\tau$ values determined in step (f).

23. The method of predicting a lifetime of a semiconductor device according to claim 18, wherein step (a) is performed for a plurality of $V_{ds}$ and $I_{ds}$ values and a plurality of $V_{gs}$ values corresponding to individual $I_{submax}$ values.

24. The method of predicting a lifetime of a semiconductor device according to claim 18, wherein wafer level test is performed simultaneously on the $10^N$ MOS transistors for about 30 minutes to about 60 minutes.

25. The method of predicting a lifetime of a semiconductor device according to claim 18, wherein a HCI lifetime a period of time corresponding to a change in $I_{ds}$ of about 10%.

26. The method of predicting a lifetime of a semiconductor device according to claim 18, wherein step (a) is performed at a plurality of temperatures.

27. A system for carrying out the method of claim 18, the system comprising:

a control processor for carrying out steps (a)–(g) of the method;

a voltage generator, said voltage generator applying appropriate voltages to the plurality of transistors in response to control signals received from the control processor; and an output device operatively connected to the control processor for visually displaying data related to the calculated projected lifetime.

* * * * *

UNITED STATES PATENT AND TRADEMARK OFFICE
CERTIFICATE OF CORRECTION

PATENT NO. : 6,873,932 B1
DATED : March 29, 2005
INVENTOR(S) : Kim

It is certified that error appears in the above-identified patent and that said Letters Patent is hereby corrected as shown below:

Column 2,
Line 19, replace "$\tau_{(10}{}^{-(N\text{-}31\ 2)}{}_{)}\%$" with -- $\tau_{(10}{}^{-(N\text{-}2)}{}_{)}\%$ --

Column 4,
Line 21, replace "$\Delta\text{Idsat}^{/\text{I}}{}_{\text{dsat}}$" with -- $\Delta\text{Idsat}/\text{I}_{\text{dsat}}$ --
Line 25, replace "injection lest method" with -- injection test method --
Line 48, replace "data call be" with -- data can be --

Column 9,
Line 4, replace "fours to" with -- hours to --

Signed and Sealed this

Seventh Day of June, 2005

JON W. DUDAS
*Director of the United States Patent and Trademark Office*